(12) United States Patent
Hishinuma et al.

(10) Patent No.: US 8,021,983 B2
(45) Date of Patent: Sep. 20, 2011

(54) METHOD OF FORMING PATTERN OF INORGANIC MATERIAL FILM COMPRISING THERMALLY INDUCED CRACKING

(75) Inventors: Yoshikazu Hishinuma, Ashigarakami-gun (JP); Takamichi Fujii, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 934 days.

(21) Appl. No.: 11/889,646

(22) Filed: Aug. 15, 2007

(65) Prior Publication Data

US 2008/0048278 A1    Feb. 28, 2008

(30) Foreign Application Priority Data

Aug. 25, 2006   (JP) ................. 2006-228605

(51) Int. Cl.
*H01L 21/033*   (2006.01)
(52) U.S. Cl. ................. 438/691; 438/759; 257/E21.035
(58) Field of Classification Search .................. 438/690, 438/691, 759, 692, 780; 257/E21.023, E21.033, 257/E21.034, E21.035, E21.036, E21.037, 257/E21.038
See application file for complete search history.

(56) References Cited

FOREIGN PATENT DOCUMENTS

| JP | 2001-347499 A | | 12/2001 |
|----|---------------|----|---------|
| JP | 2004-282514 A | | 10/2004 |
| JP | 2006-78631 | * | 3/2006 |
| JP | 2006 78631 | * | 4/2006 |
| JP | 2008-78631 | * | 4/2008 |

OTHER PUBLICATIONS

English-Language abstract and machine translation of JP 2006-78631. Retrived Jan. 1, 2011 from JPO webpage.*

* cited by examiner

*Primary Examiner* — Samuel Gebremariam
*Assistant Examiner* — Andrew O Arena
(74) *Attorney, Agent, or Firm* — Sughrue Mion, PLLC (57) ABSTRACT

A method of forming a pattern of an inorganic material film, which method is more versatile, easy, and practical. The method includes the steps of: (a) forming a sacrifice layer having a pattern on a substrate by employing a material having a different thermal expansion coefficient from that of an inorganic material of the inorganic material film; (b) forming an inorganic material layer on the substrate, on which the sacrifice layer has been formed, at a predetermined deposition temperature by employing the inorganic material; (c) lowering a temperature of at least the inorganic material layer to produce cracks in the inorganic material layer formed on the sacrifice layer; and (d) removing the sacrifice layer and the inorganic material layer formed thereon.

14 Claims, 6 Drawing Sheets

METHOD OF FORMING PATTERN OF INORGANIC MATERIAL FILM COMPRISING THERMALLY INDUCED CRACKING

BACKGROUND OF THE INVENTION

1. Field of the Invention

The present invention relates to a method of forming a pattern of an inorganic material film, and specifically, to a method of forming a pattern of an inorganic material film having functionality such as piezoelectric ceramics to be used in micro devices so called micro electrical mechanical systems (MEMS). Further, the present invention relates to a structure containing a pattern of an inorganic material film formed by using such a method.

2. Description of a Related Art

In recent years, research and development of micro electro mechanical systems (MEMS) applying semiconductor manufacturing processes have been increasingly made. Among the systems, the piezoelectric MEMS using a piezoelectric film as a functional film attracts attention as a high-power actuator, and is employed for micropumps, microcantilevers, micro ultrasonic transducers, and so on. Here, the functional film refers to a main part (typically, a layer sandwiched between electrodes) that exerts a function of an element like a dielectric film in a multilayered capacitor and a piezoelectric film in a piezoelectric actuator.

In the MEMS, it is important to finely pattern-forming the functional film. However, conventionally, for functional films having a thickness of about 5 μm or more, there are not many appropriate fine patterning methods and appropriate materials to be employed therein. For example, the etching method or the ion beam method has disadvantages that the substrate and surrounding elements are damaged, the process time is long, and the manufacturing cost is high, and therefore, the application to pattern-forming of the functional film is not so practical. Further, although the liftoff method is higher in general versatility because the material dependence is lower than that of the etching method, the photoresist generally used as a sacrifice layer in the liftoff method deforms or burns dry at about 150° C., and the method is not applicable to the case where the process temperature (deposition temperature) becomes higher then 150° C.

In the liftoff method, not only the photoresist but also silicon oxide ($SiO_2$), polysilicon, aluminum (Al), and so on are used as the sacrifice layer, and in such a case, the constraint on the deposition temperature is eased. However, the hydrofluoric acid used when removing silicon oxide and the acid or alkali solution used when removing aluminum may cause damage to the functional film. Further, since the xenon fluoride ($XeF_2$) gas used when removing polysilicon is expensive, the manufacturing cost rises. Furthermore, when the functional film is thicker than the sacrifice layer, the etchant penetration is blocked by the functional film and hard to reach the sacrifice layer, and thus, the removal of the sacrifice layer is difficult.

As a related technology, Japanese Patent Application Publication JP-P2001-347499A discloses a method of manufacturing a microdevice including the steps of forming a die by recessing a groove or pore pattern deeper than a desired functional material layer on a silicon layer, depositing a functional material in the grooves or pores of the pattern of the die in a thinner thickness than that of the silicon layer, obtaining a pattern of the functional material layer by removing the die. That is, in JP-P2001-347499A, the thickness of the sacrifice layer (Si layer) is slightly thicker than the functional film (PZT layer), and thus, the selective etching of the sacrifice layer with the etching gas is promoted through the space formed by the level difference between the films (paragraph 0027).

However, when the sacrifice layer is made thicker, the functional film may be affected by the stress of the sacrifice layer. Further, the longer time is required for the deposition and removal processes of the sacrifice layer, and as a result, the manufacturing cost increases. Furthermore, JP-P2001-347499A is not so practical because the photoresist and the organic compound film with poor heat resistance and silicon requiring an expensive etching gas such as xenon fluoride are used for the sacrifice layer.

On the other hand, Japanese Patent Application Publication JP-P2004-282514A discloses formation of a piezoelectric thin film resonator having an air-gap acoustic insulation structure on a semiconductor integrated circuit by using germanium (Ge) as a material of a sacrifice layer and etching the sacrifice layer to remove it by using a hydrogen peroxide ($H_2O_2$) solution, in order to form the air-gap acoustic insulation structure without property degradation due to damage on a CMOS circuit. However, when germanium is used for the sacrifice layer, some design ideas of forming a level difference on the substrate or the like is required for ensuring that the etchant reaches the sacrifice layer.

SUMMARY OF THE INVENTION

In view of the above-mentioned problems, a purpose of the present invention is to provide a simple and practical method of forming a pattern of an inorganic material film, and a structure containing a pattern of an inorganic material film formed by using such a method.

In order to attain the above-mentioned purpose, a method of forming a pattern of an inorganic material film according to one aspect of the present invention includes the steps of: (a) forming a sacrifice layer having a pattern on a substrate by employing a material having a different thermal expansion coefficient from that of an inorganic material of the inorganic material film; (b) forming an inorganic material layer on the substrate, on which the sacrifice layer has been formed, at a predetermined deposition temperature by employing the inorganic material; (c) lowering a temperature of at least the inorganic material layer to produce cracks in the inorganic material layer formed on the sacrifice layer; and (d) removing the sacrifice layer and the inorganic material layer formed thereon.

Further, a structure containing a pattern of an inorganic material film according to one aspect of the present invention includes: a substrate; and a pattern of an inorganic material film formed by forming a sacrifice layer having a pattern on the substrate by employing a material having a different thermal expansion coefficient from that of an inorganic material of the inorganic material film, forming an inorganic material layer thereon at a predetermined deposition temperature by employing the inorganic material, lowering a temperature of at least the inorganic material layer to produce cracks in the inorganic material layer formed on the sacrifice layer, and removing the sacrifice layer and the inorganic material layer formed thereon.

According to the present invention, cracks are produced by utilizing a difference between the thermal expansion coefficients of the sacrifice layer and the inorganic material layer formed thereon when the temperature of the substrate on which the sacrifice layer and the inorganic material layer have been formed is lowered. Thereby, the etchant becomes easier to penetrate to the sacrifice layer through the cracks, and the unwanted inorganic material layer is easily and cleanly

DESCRIPTION OF THE PREFERRED EMBODIMENTS

Hereinafter, preferred embodiments of the present invention will be explained in detail by referring to the drawings. The same reference numerals are assigned to the same component elements and the description thereof will be omitted.

In this application, a material forming a main part, that exerts a function of an element (a multilayered capacitor, a piezoelectric element, etc.), such as a dielectric film, a piezoelectric film, and so on is referred to as a material having functionality or simply as a functional material. Further, a film formed of a functional material is referred to as a functional film.

FIGS. 1A-1D are diagrams for explanation of a method of forming a pattern of an inorganic material film according to the first embodiment of the present invention.

Figure 1A:
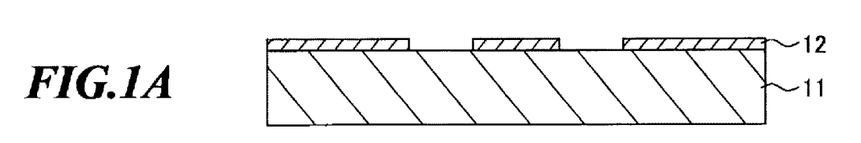
FIGS. 1A-1D are diagrams for explanation of a method of forming a pattern of an inorganic material film according to the first embodiment of the present invention.

First, as shown in FIG. 1A, a substrate 11 is prepared, and a pattern of a sacrifice layer 12 is formed thereon. For the substrate 11, a material containing at least one of silicon (Si), copper (Cu), titanium (Ti), molybdenum (Mo), tungsten (W), gallium arsenide (GaAS), sapphire, and stainless steel (SUS) is used. Further, for the sacrifice layer 12, a material having a different thermal expansion coefficient from that of an inorganic material layer 13, which will be described later, is used. Conditions and specific materials of the sacrifice layer 12 will be specifically explained as below. The pattern of the sacrifice layer 12 is formed by the general liftoff method using a resist or the like.

Figure 1B:
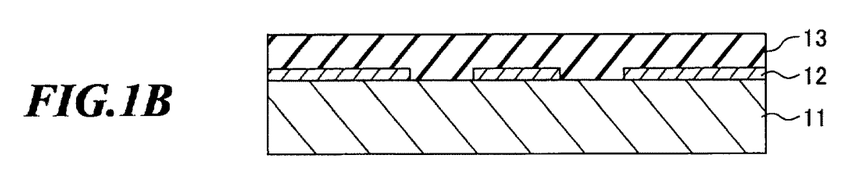

Then, as shown in FIG. 1B, the inorganic material layer 13 is formed on the substrate 11 on which the sacrifice layer 12 has been formed. The inorganic material layer 13 is a layer to be a final target patterned film (an inorganic material film). For the inorganic material layer 13, a material having a particular functionality like a piezoelectric material such as PZT (Pb (lead) zirconate titanate), a magnetic material such as $Fe_2O_3$ and $CrO_2$, a dielectric material such as $BaTiO_3$, a superconducting material such as $MgB_2$, or a general ceramic material ($Al_2O_3$ and so on) is used. It is preferable that the inorganic material layer 13 has brittleness as a property at at least one temperature within a range between the temperature, at which the inorganic material layer 13 is formed, and the room temperature. Here, the brittleness generally refers to a property of being hard, brittle, and hardly deformable. Therefore, a material having brittleness leads to rupture with little plastic deformation. Further, in view of crystal structure, it is especially preferable that the inorganic material layer 13 has a columnar crystal structure.

The inorganic material layer 13 can be formed by the known methods such as sputtering, chemical vapor deposition (CVD), and physical vapor deposition (PVD). In this regard, the deposition temperature is set to a high temperature of about 200° C. or more, desirably about 500° C. or more. Generally, the deposition temperature in CVD is 300° C. or more, and the deposition temperature for the piezoelectric film or the like by sputtering is 500° C. or more.

Figure 1C:
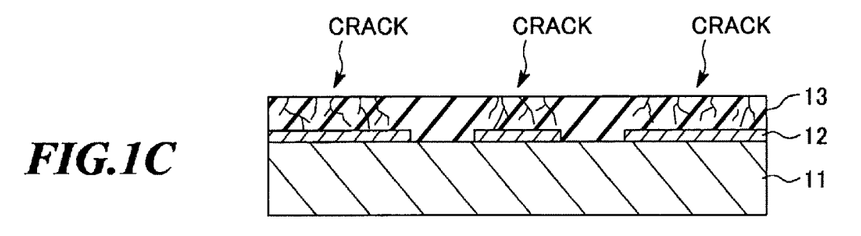

Then, the substrate after deposition and the structures thereon (the sacrifice layer 12 and the inorganic material layer 13) are held under an environment at the room temperature. Thereby, with the temperature fall of the inorganic material layer 13, cracks are produced in the inorganic material layer 13 formed on the sacrifice layer 12 due to the difference between thermal expansion coefficients of the sacrifice layer 12 and the inorganic material layer 13 as shown in FIG. 1C.

Figure 1D:
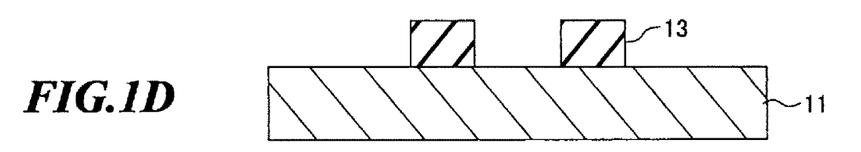

Further, the inorganic material layer 13 is immersed in an etchant. Thereby, the etchant penetrates to the sacrifice layer 12 through the cracks produced in the inorganic material layer 13, and the sacrifice layer 12 and the inorganic material layer 13 thereon are removed (lifted off) together. Consequently, as shown in FIG. 1D, the patterned functional film (the inorganic material layer 13) is obtained.

As described above, in the first embodiment of the present invention, cracks are produced in the inorganic material layer 13, and the etchant is penetrated through the cracks to the sacrifice layer 12 covered by the inorganic material layer 13. Accordingly, even when the upper surface and the side surfaces of the sacrifice layer 12 are covered by the inorganic material layer 13, for example, the sacrifice layer 12 can be easily peeled.

Here, in some cases, the inorganic material layer 13 formed on the sacrifice layer 12 can not be separated from the inorganic material layer 13 even when the sacrifice layer 12 is removed by etching. In such a case, physical acting force (external force) may be exerted on the inorganic material layer 13 by twisting the substrate 11 or tapping the inorganic material layer 13. Since the cracks have been already produced in the inorganic material layer 13 on the sacrifice layer 12, the inorganic material layer 13 can be easily separated by the external force.

For the sacrifice layer 12, materials that satisfy the following conditions are used. The conditions are: (i) there is a large difference in thermal expansion coefficients between the material and the inorganic material layer 13; (ii) the material has high heat resistance; and (iii) there is an etchant with high selectivity for the material.

The above condition (i) is required for selectively producing cracks in the inorganic material layer 13 on the sacrifice layer 12. Specifically, a material having a high thermal expansion coefficient such that a ratio of the thermal expansion coefficient of the inorganic material layer 13 to the thermal expansion coefficient of the sacrifice layer 12 is, for example, 2:1 or more is desirably used. This is because the larger the difference between the thermal expansion coefficients of them, the more the cracks can be produced when the temperature of the substrate 11 on which the sacrifice layer 12 and the inorganic material layer 13 are formed is lowered from the deposition temperature to the room temperature.

Further, the condition (ii) is required for forming the inorganic material layer 13 at a high temperature of 200° C. or more, desirably 500° C. or more. Furthermore, the condition (iii) is required for not to cause damage to the substrate 11 and the inorganic material layer 13 when the sacrifice layer 12 is removed.

As familiar materials that satisfy these conditions, gold (Au) and germanium (Ge) are cited. For example, in the case where a pattern of piezoelectric film is formed, the thermal expansion coefficient of PZT is about $5 \times 10^{-6}$ (/K), and the thermal expansion coefficient (coefficient of linear expansion) of gold is about $14 \times 10^{-6}$ (/K). That is, the thermal expansion coefficient of gold is much larger, more than twice the thermal expansion coefficient of PZT. Therefore, while the temperature of the piezoelectric film deposited at a high temperature (e.g., 200° C. or more, desirably 500° C. or more) is lowered, many cracks can be produced in the piezoelectric film on the sacrifice layer.

Further, since the melting point of gold is about 1064° C., gold can sufficiently withstand most high-temperature processes for forming the inorganic material layer 13. Furthermore, for gold, there is an etchant that is inactive to most inorganic materials (functional materials, general ceramics, and so on) and substrate materials, or an etchant having high etching selectivity (e.g., an etching selection ratio is 50:1 or more). Specifically, an etchant prepared by dissolving 5 wt % iodine ($I_2$) and 10 wt % potassium iodide (KI) in 85 wt % water ($H_2O$) is inactive to PZT and silicon.

As example 1, a pattern of PZT film is formed using the method of forming a pattern of an inorganic material film according to the first embodiment of the present invention.

As the substrate 11 shown in FIGS. 1A-1D, a silicon (Si) wafer is used. First, a resist pattern is formed on the silicon wafer by using general photolithography, and a gold film having a thickness of 0.5 μm is formed thereon as the sacrifice layer 12 by vapor deposition. Then, a pattern of gold film is formed by lifting off the resist and the gold film thereon by using acetone. Furthermore, a PZT film having a thickness of 1.5 μm is formed as the inorganic material layer 13 by sputtering. The deposition temperature is 500° C. While the temperature of the silicon wafer, on which the gold film and the PZT film had been formed, is lowered to the room temperature, many cracks are produced in the PZT film on the gold film. Furthermore, the silicon wafer is immersed in the etchant prepared by dissolving 5 wt % iodine ($I_2$) and 10 wt % potassium iodide (KI) in 85 wt % water ($H_2O$), and then, the gold film and the PZT film formed thereon are removed and a patterned PZT film is left on the silicon wafer.

Figure 2:
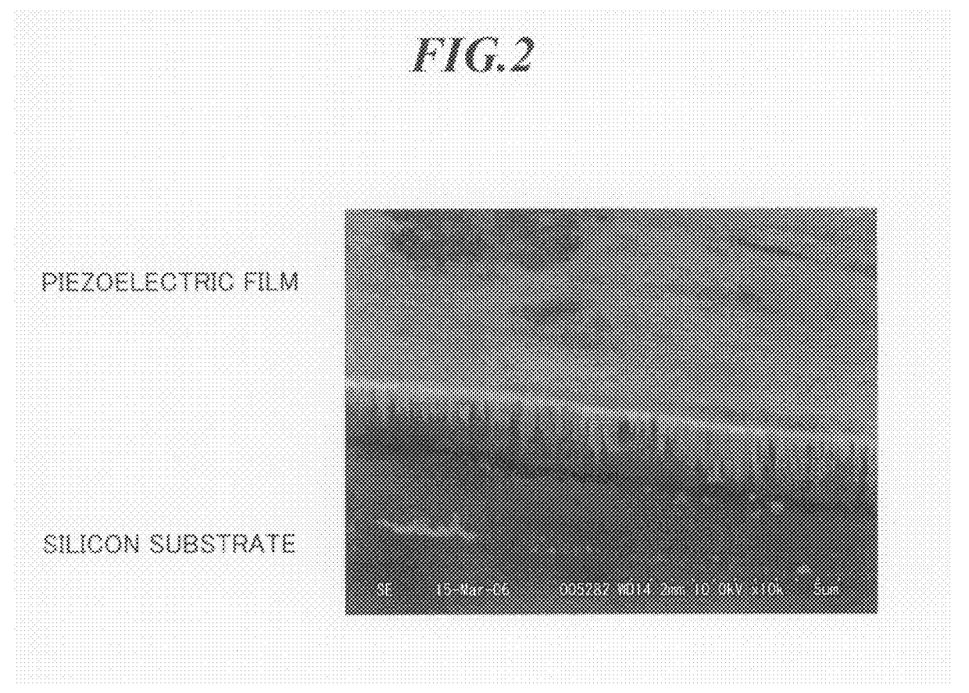
FIG. 2 is a SEM image showing a PZT film fabricated by the method of forming a pattern of an inorganic material film according to the first embodiment of the present invention.

FIG. 2 is a photograph of the PZT film fabricated in example 1 taken with a SEM (scan electron microscope). In example 1, although the PZT film (having a thickness of about 1.5 μm) is much thicker than the gold film (having a thickness of about 0.5 μm) as the sacrifice layer, the unwanted PZT film could be cleanly lifted off as shown in FIG. 2. As found in the example, the PZT fabricated by sputtering has a columnar crystal structure and the PZT film pattern having a sharp section can be obtained utilizing the nature of the columnar crystal.

As example 2, a pattern of a superconducting material, magnesium diboride ($MgB_2$) film is formed by using the method of forming a pattern of an inorganic material film according to the first embodiment of the present invention.

As the substrate 11 shown in FIGS. 1A to 1D, a sapphire substrate is used. First, a resist pattern is formed on the sapphire substrate by using general photolithography, and a germanium (Ge) film having a thickness of 100 nm is formed thereon as the sacrifice layer 12 by sputtering. Then, a pattern of Ge film is formed by lifting off the resist and the Ge film thereon by using acetone. Furthermore, an $MgB_2$ film having a thickness of 1 μm is formed as the inorganic material layer 13 by sputtering. The deposition temperature is 250° C. When the temperature of the sapphire substrate, on which the Ge film and the $MgB_2$ film have been formed, is lowered to the room temperature, many cracks are produced in the $MgB_2$ film on the Ge film. Furthermore, the sapphire substrate is immersed in a hydrogen peroxide solution as the etchant, and then, the Ge film and the $MgB_2$ film formed thereon are removed and a patterned $MgB_2$ film is left on the sapphire substrate.

Next, a method of forming a pattern of an inorganic material film according to the second embodiment of the present invention will be explained. The method of forming a pattern of an inorganic material film according to the embodiment is more suitable for the case where the inorganic material film is made thicker than that in the first embodiment. The materials of the substrate, the sacrifice layer, the inorganic material (the functional material, the general ceramics, or the like) layer are the same as those in the first embodiment.

Figure 3A:
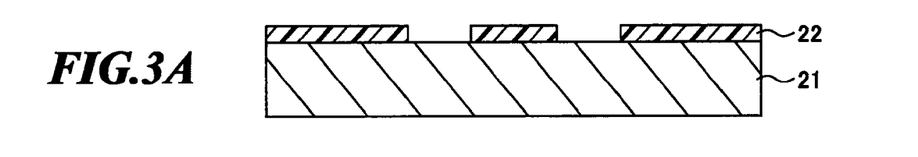
FIGS. 3A-3F are diagrams for explanation of a method of forming a pattern of an inorganic material film according to the second embodiment of the present invention.
Figure 3B:
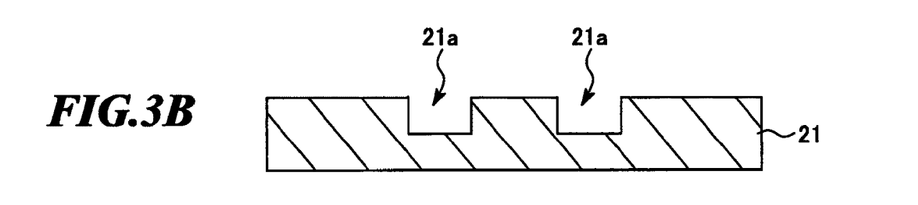

First, as shown in FIG. 3A, a resist pattern 22 is formed on a substrate 21 by photolithography. Then, an isotropic dry etching is performed on the substrate 21, and then, the resist pattern 22 is removed with acetone or the like. Thereby, as shown in FIG. 3B, a pattern with projections and depressions is formed on the substrate 21. In the embodiment, an inorganic material film is formed on depressions 21a of the pattern with projections and depressions. When the pattern with projections and depressions is formed on the substrate, not only the above-mentioned method but also a known method such as wet etching with an alkaline solution may be used.

Figure 3C:
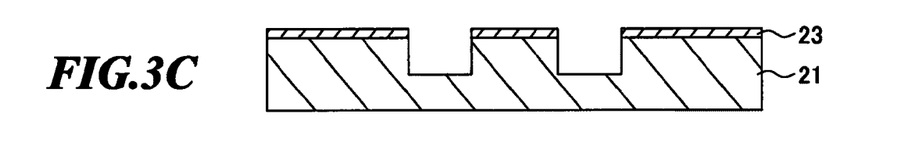

Then, as shown in FIG. 3C, a sacrifice layer 23 is formed on the projections formed on the substrate 21 by the general liftoff method by using a resist.

Figure 3D:
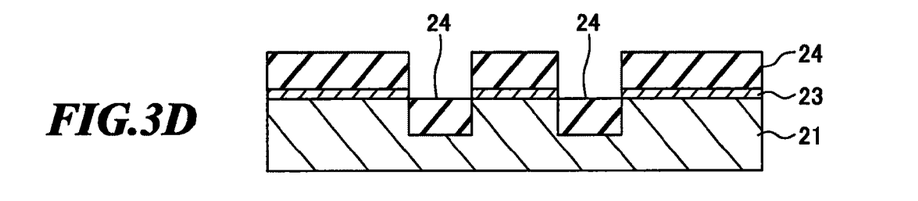
Figure 3E:
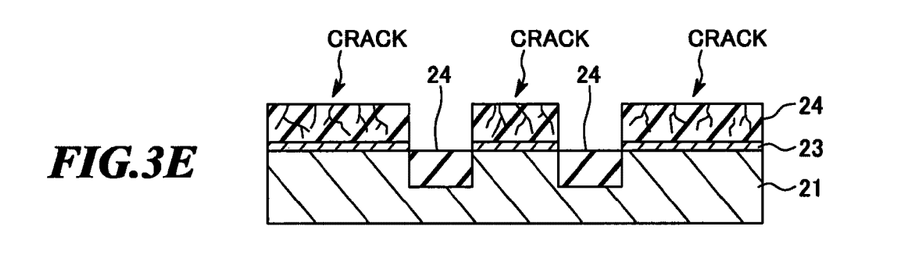

Then, as shown in FIG. 3D, an inorganic material layer 24 is formed on the substrate 21, on which the sacrifice layer 23 has been formed, at a high deposition temperature. Subsequently, the inorganic material layer 24 is held under the room temperature environment to the lower temperature, and thereby, cracks are produced in the inorganic material layer 24 on the sacrifice layer 23 as shown in FIG. 3E.

Figure 3F:
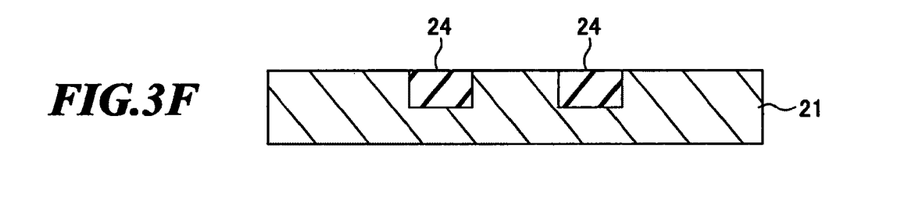

Further, the inorganic material layer 24 is immersed in an etchant so that the etchant penetrates to the sacrifice layer 23 through the cracks. Consequently, the sacrifice layer 23 and the inorganic material layer 24 formed thereon are removed, and, as shown in FIG. 3F, the patterned inorganic material film (the inorganic material layer 24) is obtained.

As described above, according to the embodiment, since the level differences (the pattern with projections and depressions) are provided on the substrate and the areas in which the inorganic material film is to be formed are separated in advance, the sacrifice layer and the inorganic material film thereon can be reliably peeled even when the inorganic material film is thicker.

As example 3, a pattern of PZT film is formed by using the method of forming a pattern of an inorganic material film according to the second embodiment of the present invention.

As the substrate 21 shown in FIGS. 3A-3F, a silicon wafer is used. Further, the depressions 21a on the substrate are formed to have a depth of about 15 μm by using the Bosch process. Here, the Bosch process is an anisotropic dry etching process of etching the bottom while coating the sidewall and advantageous to form a pattern at a high aspect ratio.

Furthermore, the sacrifice layer 23 is formed by forming a resist pattern on the substrate 21 by photolithography, forming a gold film having a thickness of 200 nm thereon by electron beam evaporation, and lifting off the resist and the gold film thereon by using acetone. Further, a PZT film having a thickness of 10 μm is formed as the inorganic material layer 24 by sputtering. The deposition temperature is 500° C. When the temperature of the silicon wafer, on which the gold film and the PZT film had been formed, is lowered to the room temperature, many cracks are produced in the PZT film formed on the gold film. Furthermore, the silicon wafer is immersed in the etchant prepared by dissolving 5 wt % iodine ($I_2$) and 10 wt % potassium iodide (KI) in 85 wt % water ($H_2O$), and then, the gold film and the PZT film formed thereon are removed and a patterned PZT film is left on the silicon wafer.

As explained above, according to the first and second embodiments, since the sacrifice layer having high heat resistance is used, the inorganic material layer can be deposited at a high temperature (200° C. or more, desirably 500° C. or more), which is not applicable to the conventional case of using a resist. Further, since the cracks are produced in the inorganic material layer and the etchant is penetrated through the cracks to the sacrifice layer, even when the thickness of the inorganic material layer is larger than that of the sacrifice layer, the sacrifice layer and the inorganic material layer thereon can be easily and cleanly removed.

Especially, it is practical to use gold as the sacrifice layer because the gold itself is a general material and various technologies are widely known as deposition methods and patterning methods for gold. Further, the etchant for removing gold causes less damage to most inorganic materials (functional materials, general ceramics, and so on) and substrate materials, and therefore, the deterioration in quality including the function of the inorganic material film can be suppressed.

Next, a method of manufacturing a piezoelectric device as application of the method of forming a pattern of an inorganic material film according to the first embodiment of the present invention will be explained.

FIGS. 4A-4H are diagrams for explanation of a method of manufacturing an FBAR (Film Bulk Acoustic Resonator) having an aluminum nitride (AlN) thin film. Here, the FBAR is a resonator having a structure in which a cavity is provided in the lower part of the resonator for freely vibrating a piezoelectric film.

Figure 4A:
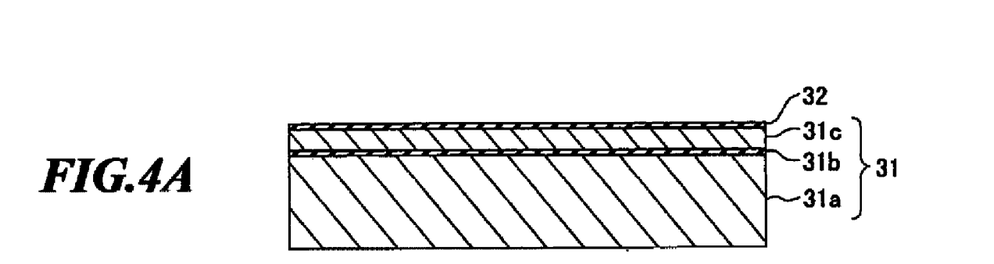
FIGS. 4A-4H are diagrams for explanation of a method of manufacturing a piezoelectric device as application of the method of forming a pattern of an inorganic material film according to the first embodiment of the present invention.

First, as shown in FIG. 4A, an SOI (Silicon on Insulator) substrate 31 is prepared. Here, the SOI substrate is a substrate having a structure in which a silicon oxide ($SiO_2$) layer 31b is inserted between a support layer (silicon substrate) 31a and an active layer (surface silicon layer) 31c. In the embodiment, an SOI wafer having a diameter of 4 inches and containing a support layer 31a having a thickness of 0.4 mm, a silicon oxide layer 31b, and an active layer 31c having a thickness of 5 μm is used. A thermally oxidized film 32 having a thickness of 0.3 μm is formed on the active layer 31c by heat-treating the SOI substrate 31 in an electric furnace.

Figure 4B:
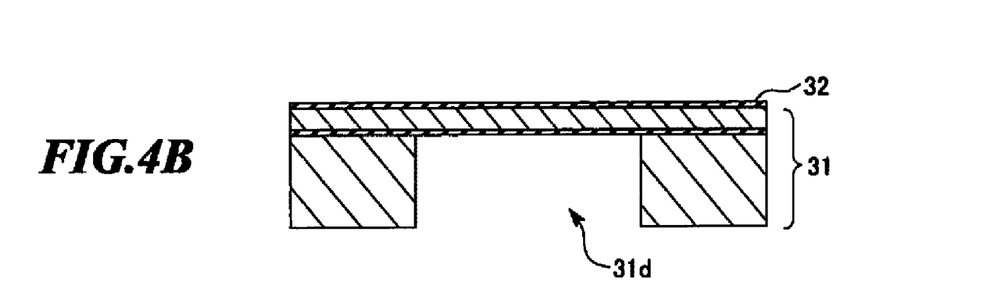

Then, as shown in FIG. 4B, an opening 31d is formed in the support layer 31a by anisotropic dry etching of the Bosch process or the like.

Figure 4C:
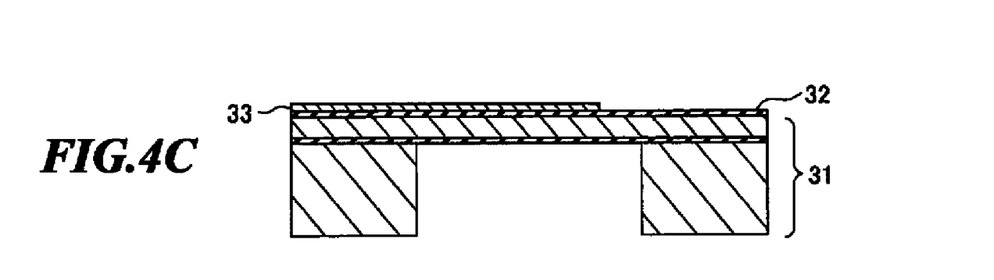

Then, as shown in FIG. 4C, a lower electrode layer 33 is formed in a region corresponding to the opening 31d. The lower electrode layer 33 may be formed of one kind of metal or may have a two-layer structure containing an adhesive layer provided for improving the junction with an adjacent layer and a conductive layer. In the embodiment, the lower electrode layer 33 contains a titanium (Ti) layer having a thickness of 10 nm as the adhesive layer and a platinum (Pt) layer having a thickness of 100 nm as the conductive layer. Further, the pattern of the lower electrode layer 33 is formed by reactive ion etching (RIE), for example.

Figure 4D:
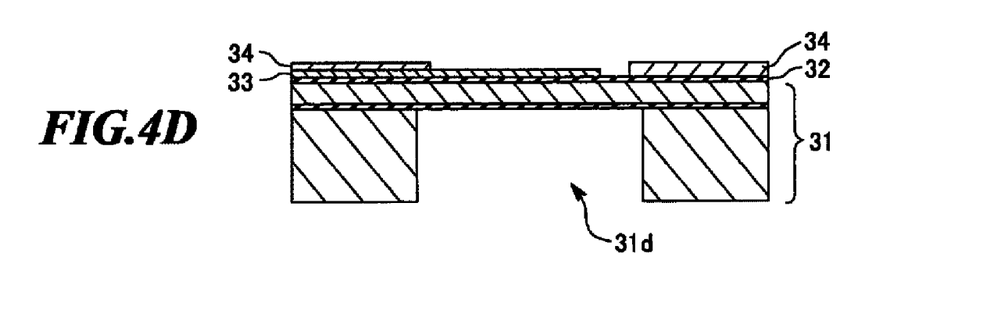

Then, as shown in FIG. 4D, a gold film having a thickness of 200 nm is formed by electron beam evaporation and a pattern is formed by the general liftoff method thereon, and thereby, a sacrifice layer 34 of gold film is formed in the region except the position corresponding to the opening 31d.

Figure 4E:
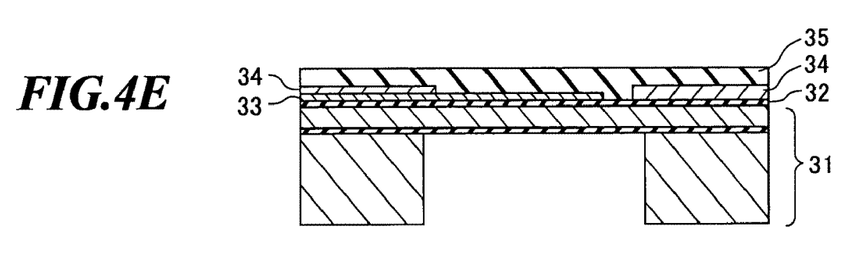
Figure 4F:
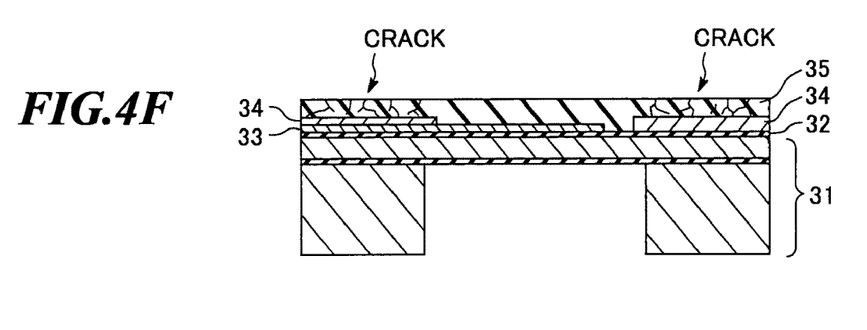

Then, as shown in FIG. 4E, an aluminum nitride (AlN) layer 35 is formed on the substrate 31, on which the sacrifice layer 34 has been formed, by magnetron sputtering at a deposition temperature of 250° C. The temperature of the SOI substrate 31, on which the sacrifice layer 34 of gold film and the aluminum nitride layer 35 have been formed, is lowered to the room temperature, and thereby, cracks are produced in the aluminum nitride layer 35 on the sacrifice layer 34 as shown in FIG. 4F.

Figure 4G:
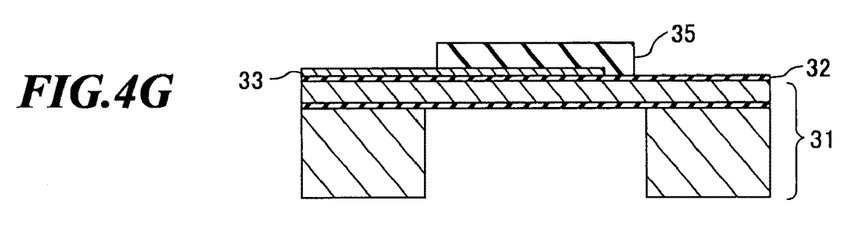

Then, the aluminum nitride layer 35 is immersed in an etchant prepared by dissolving 5 wt % iodine ($I_2$) and 10 wt % potassium iodide (KI) in 85 wt % water ($H_2O$), and thereby, the sacrifice layer 34 and the aluminum nitride layer 35 thereon are removed. Thus, a patterned aluminum nitride layer 35 is obtained as shown in FIG. 4G.

Figure 4H:
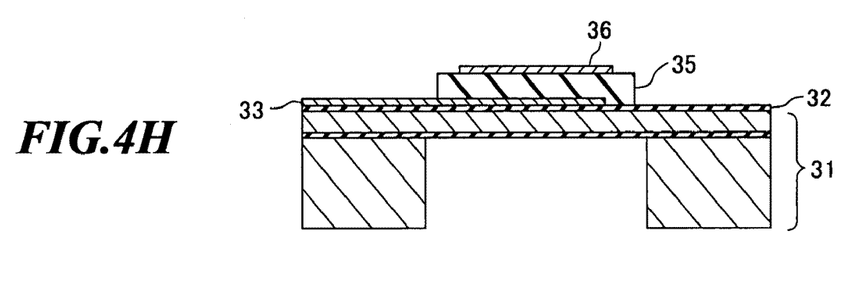

Furthermore, as shown in FIG. 4H, an upper electrode layer 36 is formed by forming a titanium layer having a thickness of 10 nm and a platinum layer having a thickness of 100 nm on the aluminum nitride layer 35 and forming a pattern in those layers by dry etching. Thereby, the FBAR having the AlN thin film is completed.

Next, a method of manufacturing another piezoelectric device as application of the method of forming a pattern of an inorganic material film according to the first embodiment of the present invention will be explained.

Figure 5:
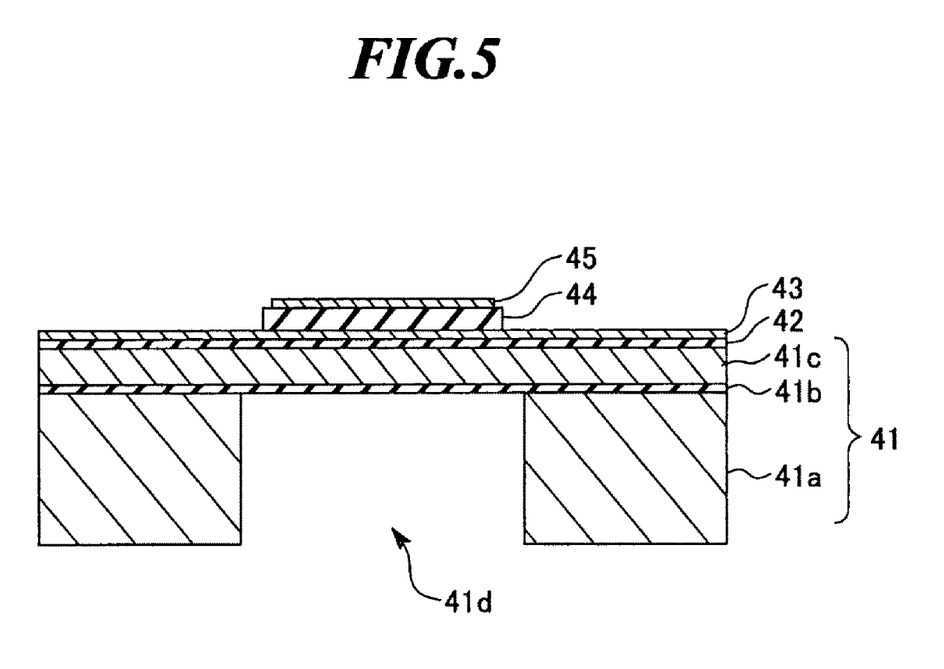
FIG. 5 is a sectional view showing a diaphragm type piezoelectric actuator manufactured by applying the method of forming a pattern of an inorganic material film according to the first embodiment of the present invention.

FIG. 5 is a sectional view showing a diaphragm type piezoelectric actuator. Here, the diaphragm type piezoelectric actuator is an actuator for displacing diaphragms 41b to 43 by applying a voltage between a lower electrode layer 42 and an upper electrode layer 45 to expand and contract a piezoelectric film 44. Such an actuator is applied to micropumps, ultrasonic transducers, inkjet heads, and so on.

The diaphragm type piezoelectric actuator is fabricated in the following manner. First, an SOI substrate 41 is prepared. In the embodiment, an SOI wafer having a diameter of 4 inches and containing a support layer 41a having a thickness of 0.4 mm, a silicon oxide layer 41b, and an active layer 41c having a thickness of 10 μm is used. A thermally oxidized film 42 having a thickness of 0.5 μm is formed on the active layer 41c by heat-treating the SOI substrate 41 in an electric furnace.

Then, a lower electrode layer 43 containing a titanium (Ti) layer having a thickness of 20 nm and a platinum (Pt) layer having a thickness of 150 nm is formed on the thermally oxidized film 42.

Furthermore, a pattern of the piezoelectric film 44 having a thickness of 3 μm is formed in a position corresponding to an opening 41d by the method of forming a pattern of an inorganic material film according to the first embodiment. That is, a gold film having a thickness of 200 nm as a sacrifice layer is formed in the region except the position corresponding to the opening 41d on the lower electrode 43. Then, PZT is deposited thereon by sputtering and the temperature of the PZT film is lowered, and thereby, cracks are produced in the PZT film on the gold film. Furthermore, the gold film and the PZT film thereon are removed by using an etchant for gold (5 wt % iodine, 10 wt % potassium iodide, and 85 wt % water).

The upper electrode layer 45 is formed on thus formed pattern of the piezoelectric film 44. That is, a resist pattern for the upper electrode layer 45 is formed by photolithography, a titanium layer having a thickness of 20 nm and a platinum layer having a thickness of 150 nm are formed by sputtering, and further, the resist pattern is removed with acetone. Thereby, the diaphragm type piezoelectric actuator is completed.

In the above-explained examples 1-3 and various methods of manufacturing devices, a pattern of an inorganic material film having functionality is formed. However, a pattern of a film can be formed by using the same method with respect to inorganic materials having no specific function (so-called ceramics such as metal oxides including $Al_2O_3$ and MgO and metal nitrides). For example, accurate channels (e.g., ink supply channels in an inkjet head), micro vibrators (e.g., vibratable walls as part of an ink chamber of an inkjet head), and so on can be formed with general ceramic materials by applying the first and second embodiments.

The invention claimed is:

1. A method of forming a pattern of an inorganic material film, said method comprising the steps of:
    (a) forming a sacrifice layer on a substrate, said sacrifice layer having a pattern and made of a material having a different thermal expansion coefficient from that of an inorganic material of said inorganic material film;
    (b) forming an inorganic material layer on said substrate and said sacrifice layer at a predetermined deposition temperature, said inorganic material layer made of said inorganic material;
    (c) lowering a temperature of at least said inorganic material layer to produce cracks in said inorganic material layer formed on said sacrifice layer; and
    (d) removing said sacrifice layer and said inorganic material layer formed thereon.

2. The method according to claim 1, wherein step (b) includes forming said inorganic material layer at a deposition temperature not less than 200°.

3. The method according to claim 1, wherein step (b) includes forming said inorganic material layer to a thickness larger than that of said sacrifice layer.

4. The method according to claim 1, wherein step (b) includes forming said inorganic material layer by one of sputtering, chemical vapor deposition (CVD), and physical vapor deposition (PVD).

5. The method according to claim 1, wherein step (d) includes wet-etching said sacrifice layer by employing one of an etchant, which is inactive to said substrate and said inorganic material layer, and an etchant having a selection ratio of not less than 50:1 to said sacrifice layer and said inorganic material layer.

6. The method according to claim 5, wherein step (d) includes removing said inorganic material layer formed on said sacrifice layer by applying a physical acting force to said inorganic material layer after wet-etching said sacrifice layer.

7. The method according to claim 1, further comprising the step of:
    forming a recessed portion, which corresponds to the pattern of said inorganic material film, on said substrate prior to step (a).

8. The method according to claim 1, wherein a ratio of the thermal expansion coefficient of said inorganic material layer to that of said sacrifice layer is not less than 2:1.

9. The method according to claim 1, wherein said sacrifice layer includes a material which is stable at the deposition temperature and in a deposition atmosphere of said inorganic material layer.

10. The method according to claim 1, wherein said sacrifice layer includes one of gold (Au) and germanium (Ge).

11. The method according to claim 1, wherein said inorganic material has functionality.

12. The method according to claim 11, wherein said inorganic material includes one of a piezoelectric material, a magnetic material, a dielectric material, and a superconducting material.

13. The method according to claim 1, wherein said inorganic material layer has a columnar crystal structure.

14. The method according to claim 1, wherein said substrate includes at least one of silicon (Si), copper (Cu), titanium (Ti), molybdenum (Mo), tungsten (W), gallium arsenide (GaAS), sapphire, and stainless steel (SUS).

* * * * *